United States Patent
Park et al.

(10) Patent No.: US 6,893,981 B2
(45) Date of Patent: May 17, 2005

(54) METHOD OF MANUFACTURING A SEMICONDUCTOR DEVICE BY RTA PROCESS IN NITROGEN ATMOSPHERE

(75) Inventors: Sang Wook Park, Seoul (KR); Seung Cheol Lee, Ichon-Shi (KR)

(73) Assignee: Hynix Semiconductor Inc., Ichon-shi (KR)

( * ) Notice: Subject to any disclaimer, the term of this patent is extended or adjusted under 35 U.S.C. 154(b) by 0 days.

(21) Appl. No.: 10/610,628

(22) Filed: Jul. 2, 2003

(65) Prior Publication Data

US 2004/0115894 A1 Jun. 17, 2004

(30) Foreign Application Priority Data

Dec. 12, 2002 (KR) .................................. 10-2002-0079209

(51) Int. Cl.$^7$ ........................ H01L 21/31; H01L 21/469
(52) U.S. Cl. ........................ 438/775; 438/527; 438/768; 438/770; 438/787
(58) Field of Search ........................ 438/238, 239, 438/396, 397, 419, 442, 443, 451, 527, 548, 768–770, 775, 787

(56) References Cited

U.S. PATENT DOCUMENTS 5,573,965 A * 11/1996 Chen et al. .................. 438/297
5,891,809 A * 4/1999 Chau et al. .................. 438/770
6,660,657 B1 * 12/2003 Sandhu et al. .............. 438/775
2002/0142559 A1 * 10/2002 Ping ........................... 438/396
2003/0052377 A1 * 3/2003 Weimer ....................... 257/411

FOREIGN PATENT DOCUMENTS

JP          10-129838         5/1998    ....... H01L/21/8247

* cited by examiner

*Primary Examiner*—Asok Kumar Sarkar

(74) *Attorney, Agent, or Firm*—Mayer, Brown, Rowe & Maw LLP

(57) ABSTRACT

Disclosed is a method of manufacturing a semiconductor device. A gate is formed on a given region of a semiconductor substrate. Spacers are then formed using DCS-HTO or TEOS. Hydrogen remaining within the spacers is removed by a RTA process under nitrogen atmosphere and nitride films are formed on the spacers at the same time. In case of a flash memory device, a retention characteristic can be improved. A process of forming the nitride film additionally required in a subsequent contact hole formation process may be omitted. The sheet resistance of the gate could be improved by promoting growth of a crystal grain of a tungsten silicide film constituting a control gate.

11 Claims, 2 Drawing Sheets

METHOD OF MANUFACTURING A SEMICONDUCTOR DEVICE BY RTA PROCESS IN NITROGEN ATMOSPHERE

BACKGROUND OF THE INVENTION

1. Field of the Invention

The present invention relates to a method of manufacturing a semiconductor device, and more particularly, to a method of manufacturing a semiconductor device capable of improving a retention characteristic in case of a flash memory device, in such a manner that a gate is formed on a given region of a semiconductor substrate, spacers are formed using DCS-HTO or TEOS, and hydrogen remaining within the spacers are removed and nitride films are formed on the spacers at the same time, by implementing a RTA process under nitrogen atmosphere.

2. Background of the Related Art

A prior art method of manufacturing a semiconductor device will be described taking the flash memory device of FIG. 1 as an example.

A stack gate on which a tunnel oxide film 12, a first polysilicon film 13, a dielectric film 14, a second polysilicon film 15 and a tungsten silicide film 16 are sequentially stacked is formed on a given region of the semiconductor substrate 11. At this time, the first polysilicon film 13 serves as a floating gate, and the second polysilicon film 15 and the tungsten silicide film 16 serve as a control gate. Next, spacers 17 are formed at the sidewall of the stack gate using DCS-HTO. An impurity ion implantation process is then implemented to form junction regions 18 in given regions of the semiconductor substrate 11.

In the flash memory device manufactured by the above process, a charge retention characteristic greatly influences a reliability characteristic of the device. Today, as DCS-HTO and a $Si_2H_2Cl_2$ source gas are employed in order to form the spacers in the flash memory device, hydrogen exists within the spacers due to reaction such as [Chemical Equation 1].

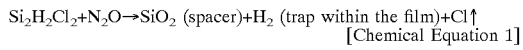
[Chemical Equation 1]

In particular, since the annealing process is implemented in a subsequent furnace equipment for a long period of time, it is much easy for hydrogen to diffuse into the film constituting the stack gate. This hydrogen is trapped inside the film constituting the stack gate and is diffused into the tunnel oxide film by a subsequent annealing process. Hydrogen existing within the tunnel oxide film forms Si—H bonding. Electrons that are moved in the future program and erase operation are neutralized by hydrogen in the tunnel oxide film to cause a charge loss phenomenon. As a result, a charge retention characteristic that is most important in the flash memory device is degraded.

SUMMARY OF THE INVENTION

Accordingly, the present invention is contrived to substantially obviate one or more problems due to limitations and disadvantages of the related art.

An object of the present invention is to provide a method of manufacturing a semiconductor device capable of improving reliability of the device by completely removing hydrogen remaining within spacers in the process of forming the spacers.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

In the present invention, after spacers are formed using DCS-HTO, a RTA (rapid thermal anneal) process is implemented under nitrogen atmosphere. N—O bonding is formed by implementing the RTA process, so that the nitride films are created on the spacers and hydrogen is separated at the same time, which results in diffusing hydrogen toward the outside. This is caused by a phenomenon that hydrogen is gettered by nitrogen. H—Si bonding energy is 2.3 eV and H—N bonding energy is 4.1 eV from the viewpoint of a binding energy. As a result, since the bonding energy of hydrogen and nitrogen is higher than those of hydrogen and silicon, hydrogen is separated on the surface and is outgassed, so that trapped hydrogen is removed. Therefore, a retention characteristic of the flash memory device could be improved. Furthermore, as the nitride films are formed on the spacers, a process of forming the nitride film additionally required in a subsequent contact hole formation process may be omitted. The sheet resistance of the gate could be improved by promoting growth of a crystal grain of a tungsten silicide film constituting a control gate.

FIG. 2 is a graph illustrating the result of TDS-analyzing spacers formed using DCS-HTO. From FIG. 2, it can be seen that hydrogen is trapped within the spacers A and hydrogen is effectively removed through a subsequent nitrogen RTA (rapid thermal anneal) process B.

To achieve these objects and other advantages and in accordance with the purpose of the invention, as embodied and broadly described herein, a method of manufacturing a semiconductor device according to the present invention is characterized in that it comprises the steps of forming a gate on a given region of a semiconductor substrate, forming spacers at the sidewalls of the gate, implementing a RTA (rapid thermal anneal) process under nitrogen atmosphere to form nitride films on the spacers, and implementing an impurity ion implantation process to form junction regions in given regions of the semiconductor substrate.

In the above, the spacers are formed using DCS-HTO or TEOS. The RTA process is implemented by stepping up the temperature of a furnace at a rate of 5~15° C./sec to keep 600~800° C., keeping a pressure $2~5 \times 10^{-3}$ Torr and introducing nitrogen gas of 4~10 sccm.

In another aspect of the present invention, it is to be understood that both the foregoing general description and the following detailed description of the present invention are exemplary and explanatory and are intended to provide further explanation of the invention as claimed.

BRIEF DESCRIPTION OF THE DRAWINGS

The above and other objects, features and advantages of the present invention will be apparent from the following detailed description of the preferred embodiments of the invention in conjunction with the accompanying drawings, in which.

DETAILED DESCRIPTION OF THE PREFERRED EMBODIMENT

Figure 1:
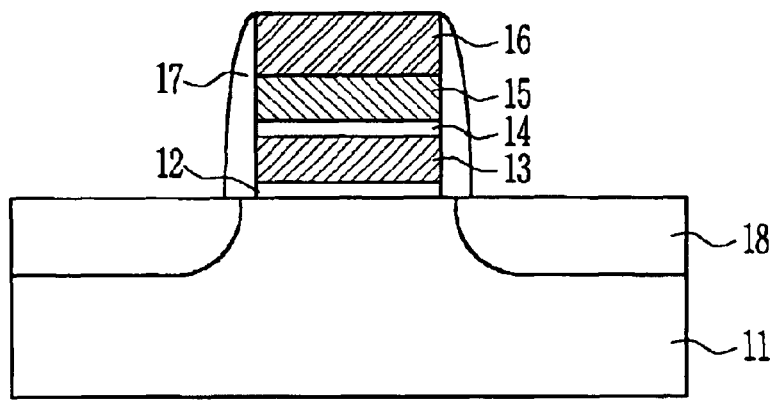
FIG. 1 is a cross-sectional view of a semiconductor device for explaining a prior art method of manufacturing the device.
Figure 2:
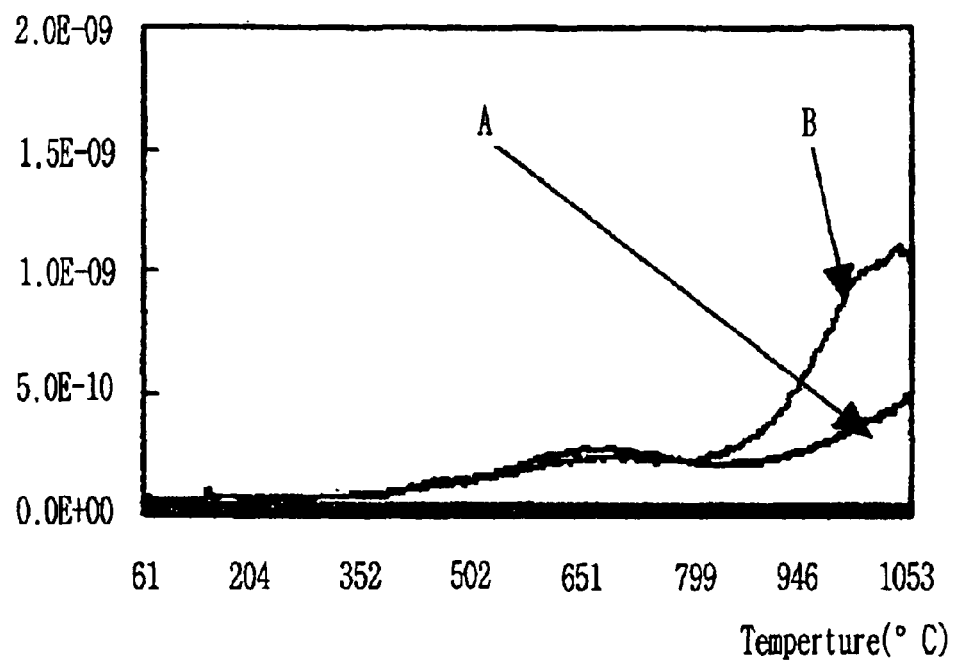
FIG. 2 is a graph illustrating the result of TDS-analyzing spacers formed using DCS-HTO.

Reference will now be made in detail to the preferred embodiments of the present invention, examples of which are illustrated in the accompanying drawings, in which like reference numerals are used to identify the same or similar parts.

Figure 3A:
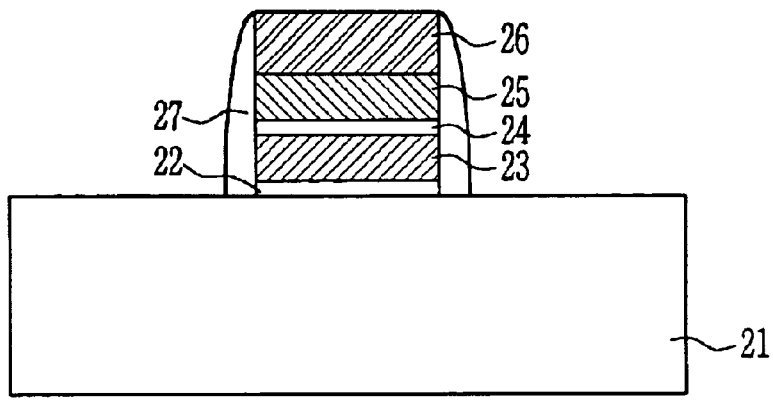
FIG. 3A~FIG. 3C are cross-sectional views of semiconductor devices for explaining a method of manufacturing the device according to a preferred embodiment of the present invention.
Figure 3B:
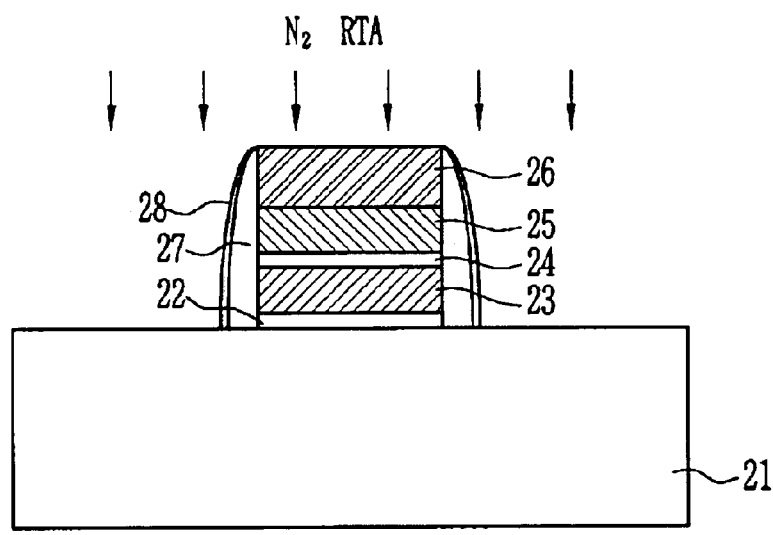
Figure 3C:
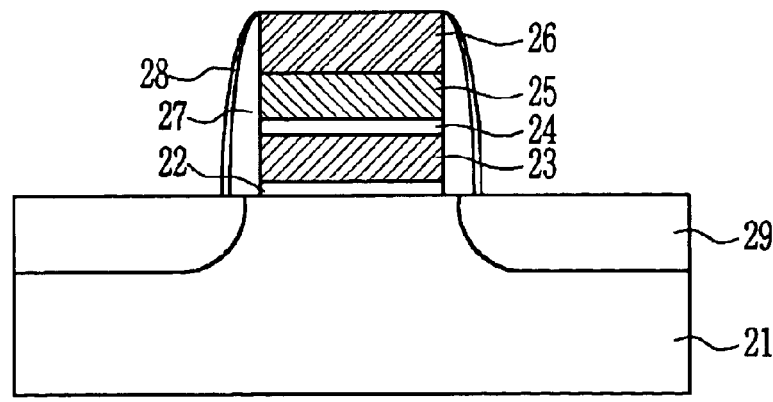

FIG. 3A~FIG. 3C are cross-sectional views of semiconductor devices for explaining a case where a method of manufacturing the device according to a preferred embodiment of the present invention is applied to the flash memory device as an example.

Referring to FIG. 3A, a stack gate on which a tunnel oxide film 22, a first polysilicon film 23, a dielectric film 24, a second polysilicon film 25 and a tungsten silicide film 26 are stacked is formed on a given region of a semiconductor substrate 21. At this time, the first polysilicon film 23 serves as a floating gate, and the second polysilicon film 25 and the tungsten silicide film 26 serve as a control gate. Next, spacers 27 are formed at the sidewalls of the stack gate using DCS-HTO or TEOS. This causes hydrogen to remain within the spacers 27.

In the above, the tunnel oxide film 22 is formed in thickness of 60~100 Å at a temperature of 750~950° C. under a pressure of 200~500 mTorr. The first polysilicon film 23 is formed in thickness of 700~2000 Å at a temperature of 530~610° C. under a pressure of 200~500 mTorr. At this time, the first polysilicon film 23 is formed using a doped polysilicon film doped at a concentration of 1.3E20~2.72E20 atoms/cc and is formed to have a sheet resistance of about 400~800 Ω/seq. Furthermore, the dielectric film 24 has a structure on which an oxide film, a nitride film and an oxide film are stacked and is formed in thickness of 130~160 Å using DCS-HTO at a temperature of 680~780° C. under a pressure of 200~500 mTorr. Also, the second polysilicon film 25 is formed in thickness of 500~1000 Å at a temperature of 530~610° C. under a pressure of 200~500 mTorr. When the tungsten silicide film 26 is formed, it is formed to have a dual structure of a doped polysilicon film and an undoped polysilicon film in order to prevent penetration fluorine atoms. The tungsten silicide film 26 is formed in thickness of 700~1500 Å at a temperature of 390~430° C. under a pressure of 200~500 mTorr. The tungsten silicide film 26 is formed by introducing a $WF_6$ gas of 3.4 sccm and a $SiH_4$ gas of 2.9 sccm.

By reference to FIG. 3B, a RTA (rapid thermal anneal) process is implemented under nitrogen atmosphere to form a N—O bonding. Due to this, nitride films 28 are created on the spacers 27 and hydrogen is separated at the same time, which results in diffusing hydrogen toward the outside. H—Si bonding energy is 2.3 eV and H—N bonding energy is 4.1 eV from the viewpoint of a binding energy. In the end, as the bonding energy of hydrogen and nitrogen is higher than those of hydrogen and silicon, hydrogen is separated on the surface and outgassed, so that trapped hydrogen is removed. Furthermore, as the nitride films 28 are formed on the spacers 27, a process of forming the nitride film that is additionally required in a subsequent contact hole formation process could be omitted. Also, as the anneal process is implemented in a short period of time, growth of a crystal grain of the tungsten silicide film 26 is facilitated to improve the sheet resistance of the gate. At this time, the RTA process is implemented by stepping up the temperature of the furnace at a rate of 5~15° C./sec to keep 600~800° C., keeping a pressure 2~5×10$^{-3}$ Torr and introducing nitrogen gas of 4~10 sccm. The nitride film 28 formed thus is formed in thickness of 2~8 nm.

With reference to FIG. 3C, an impurity ion implantation process is implemented to form a junction region 29 on a given region of the semiconductor substrate 21.

As described above, according to the present invention, after spacers are formed using DCS-HTO or TEOS, hydrogen remaining within the spacers is removed and nitride films are formed on the spacers at the same time, by implementing a RTA (rapid thermal anneal) process under nitrogen atmosphere. Therefore, the present invention has new effects that it can improve a retention characteristic of a flash memory device, omit a process of forming the nitride film additionally required in a subsequent contact hole formation process, and promote growth of a crystal grain of a tungsten silicide film constituting a control gate to improve the sheet resistance of the gate.

The forgoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. A method of manufacturing a semiconductor device, comprising the steps of:

forming a gate including a silicide film on a given region of a semiconductor substrate;

forming spacers made of oxide film on the sidewalls of the gate;

implementing an RTA process under nitrogen atmosphere to form nitride films on the spacers, wherein the RTA process is implemented to promote growth of a crystal grain of the silicide film and remove hydrogen trapped in the spacers; and implementing an impurity ion implantation process to form junction regions in given regions of the semiconductor substrate.

2. The method as claimed in claim 1, wherein the spacers are formed using DCS-HTO or TEOS.

3. The method as claimed in claim 1, wherein the RTA process is implemented by stepping up the temperature of a furnace at a rate of 5~15° C./sec to keep 600~800° C., keeping a pressure 2~5×10$^{-3}$ Torr and introducing nitrogen gas of 4~10 sccm.

4. The method as claimed in claim 1, wherein the nitride film is formed in thickness of 2~8 nm.

5. The method as claimed in claim 1, wherein a step of forming the gate comprises the step of: forming a tunnel oxide film, a first polysilicon film, a dielectric film, a second polysilicon film, and the silicide film.

6. The method as claimed in claim 5, wherein the tunnel oxide film is formed in a thickness of 60~100 Å at a temperature of 750~950° C. under a pressure of 200~500 mTorr.

7. The method as claimed in claim 5, wherein the first polysilicon film is formed in a thickness of 700~2000 Å at a temperature of 530~610° C. under a pressure of 200~500 mTorr and formed using a doped polysilicon film doped at a concentration of 1.3E20~2.72E20 atoms/cc.

8. The method as claimed in claim 5, wherein the dielectric film has a structure on which an first oxide film, a nitride film and an second oxide film are sequentially stacked.

9. The method as claimed in claim 5, wherein the second polysilicon film is formed in a thickness of 500~1000 Å at a temperature of 530~610; É under a pressure of 200~500 mTorr.

10. The method as claimed in claim 5, wherein the silicide film is a formed in thickness of 700~1500 Å at a temperature of 390~430; É under a pressure of 200~500 mTorr.

11. The method as claimed in claim 5, wherein the silicide film is formed by introducing a $WF_6$ gas of about 3.4 sccm and $SiH_4$ gas of about 2.9 sccm.

* * * * *